United States Patent
Labrum et al.

(10) Patent No.: US 7,075,856 B2
(45) Date of Patent: *Jul. 11, 2006

(54) APPARATUS FOR LATENCY SPECIFIC DUTY CYCLE CORRECTION

(75) Inventors: Nick N. Labrum, Boise, ID (US); Paul A. Silvestri, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 11/124,784

(22) Filed: May 9, 2005

(65) Prior Publication Data

US 2005/0206420 A1    Sep. 22, 2005

Related U.S. Application Data

(63) Continuation of application No. 10/898,762, filed on Jul. 26, 2004, now Pat. No. 6,920,081, which is a continuation of application No. 10/230,546, filed on Aug. 29, 2002, now Pat. No. 6,768,697.

(51) Int. Cl.
*G11C 8/00* (2006.01)
*H03K 7/08* (2006.01)

(52) U.S. Cl. .................. 365/233; 365/194; 327/175
(58) Field of Classification Search .............. None
See application file for complete search history.

(56) References Cited

U.S. PATENT DOCUMENTS

| | | | | |
|---|---|---|---|---|
| 5,467,041 | A | 11/1995 | Baba et al. | 327/276 |
| 5,550,499 | A | 8/1996 | Eitrheim | 327/175 |
| 5,757,218 | A | 5/1998 | Blum | 327/175 |
| 6,285,226 | B1 | 9/2001 | Nguyen | 327/175 |
| 6,342,801 | B1 * | 1/2002 | Shin | 327/175 |
| 6,385,129 | B1 | 5/2002 | Silvestri | 365/233 |
| 6,744,281 | B1 * | 6/2004 | Harrison | 326/93 |
| 6,768,697 | B1 | 7/2004 | Labrum et al. | 365/233 |

* cited by examiner

Primary Examiner—Son Mai
(74) Attorney, Agent, or Firm—Fletcher Yoder

(57) ABSTRACT

The illustrated embodiments relate to a control circuit that is adapted to use a latency signal to generate an output signal. The latency is adapted to be used to create a control signal that is dependent on the latency signal. The control signal is adapted to be used to select from among multiple input sources. The selected input source is adapted to be used to create an output signal.

30 Claims, 3 Drawing Sheets

APPARATUS FOR LATENCY SPECIFIC DUTY CYCLE CORRECTION

CROSS-REFERENCE TO RELATED APPLICATION

This application is a continuation of U.S. patent application Ser. No. 10/898,762, by Nick N. Labrum and Paul A. Silvestri, entitled "Apparatus for Latency Specific Duty Cycle Correction," filed on Jul. 26, 2004 now U.S. Pat. No. 6,920,081, which is a continuation of U.S. patent application Ser. No. 10/230,546, by Nick N. Labrum and Paul A. Silvestri, entitled "Method and Apparatus for Latency Specific Duty Cycle Correction," filed on Aug. 29, 2002, U.S. Pat. No. 6,768,697.

BACKGROUND OF THE INVENTION

1. Field of the Invention

This present invention relates generally to the field of integrated circuit design and, more specifically, to producing more precise integrated circuit control signals.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Computer systems and other electronic devices typically include a variety of electrically interconnected integrated circuit (IC) packages which perform a variety of functions, including memory and processing functions. Integrated circuits, including memory devices, employ a variety of control signals to facilitate their operation. Examples of these control signals include clock, clock enable, address, data and the like. As integrated circuits continue to be designed for faster operation, the need for the control signals to be more precise becomes increasingly important. This is true because faster operational speeds are only possible by reducing the margin for error in the operation of the integrated circuit.

As an example, many types of integrated circuits have specifications for minimum setup and hold times. These specifications relate to the amount of time that is allowable for various operating conditions, such as the application or stabilization of an input signal. Setup and hold times may be required for certain signals before a new operation, such as a data read or data write, may occur. The setup and hold times for a given integrated circuit component are typically the shortest time for which correct operation of the device can be ensured. In other words, if an integrated circuit device is operated with setup and hold times that are shorter than the specified minimum setup and hold times, the device may not operate properly. Integrated circuits can be designed for faster operation only if minimum timing requirements such as setup and hold times can be made shorter.

Another important control signal for integrated circuit operation is the clock signal. Clock signals provide the "heartbeat" for the operation of many integrated circuits. Many timing and control operations, such as the strobing in of data and the like, are synchronized with the clock cycle. In many electronic systems, a single system clock will be provided to many different integrated circuit components (chips) so that all of the integrated circuits may operate based on a single clock signal. This type of system may be referred to as a synchronous system.

In a synchronous system, the precision and integrity of the clock signal is extremely important. Slight variations in the clock signal may adversely affect the operation of one or more integrated circuits. Also, there are many design challenges in providing an exact, precise clock signal to all integrated circuits in a given system. One problem that is commonly encountered is duty cycle skew.

An ideal clock signal is typically a perfect square wave with a 50% duty cycle. This means that the clock is at a logical high ("1") level for exactly 50% of the time and at a logical low ("0") level for exactly 50% of the time. Physical characteristics of a circuit board such as trace length or imprecision in the creation of the transitions between the logical high state and the logical low state (or vice versa) may contribute to a clock having a skewed duty cycle. An example of a clock with a skewed duty cycle is a clock that remains high for 51% of the time while remaining low for only 49% of the time. This skew may adversely impact the performance of some integrated circuits that use the skewed clock signal for synchronization.

Presently known clock skew correction circuits may employ a delay line to slightly delay a clock signal before it is delivered to another device. A multiplexer may be used to provide a more precise clock signal. In such an arrangement, the multiplexer may receive as inputs an original clock signal and the delayed clock signal, which is produced by passing the original clock signal through the delay line. The output of the multiplexer may be used as a clock signal to be delivered to another device. The selection of multiplexer input (the original clock signal or the delayed clock signal) may be controlled by a control signal. The control signal may select either the original clock signal or the delayed clock signal to provide as the output of the multiplexer, depending on which input signal will cause the output signal of the multiplexer to have a more precise duty cycle. For example, if the time in which the original clock signal is low accounts for only 49% of the period of the clock signal, the control line may select the delayed output when the original clock signal goes low to increase the time the clock outputs a logical low. In this manner, the duty cycle of the clock output of the multiplexer may be corrected to be more precise.

One factor that contributes to duty cycle skew, however, is device latency. Many integrated circuits, including dynamic random access memories (DRAMs), may have internal latency signals to provide synchronization for data output from the DRAM. The latency of the device is generally the amount of time it takes for the device to produce valid output data upon receiving a read request. Latency of a DRAM may be specified in clock cycles, such as two (2) clock cycles or one and one-half (1½) clock cycles.

The latency for a given device may be selectable by a user during device initialization or operation. For example, the latency of a DRAM may be programmed using a load mode cycle. After the latency of the device is programmed, the internal latency signal may be used to synchronize events inside the device. Because of individual device and layout characteristics, latency signals may undesirably introduce error or skew into clock signals or other control signals that are dependent on the latency signal. A compounding problem is that skew may occur when certain latency periods are programmed, but not when other latency periods are employed. A clock skew correction circuit that takes into account device latency is desirable.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
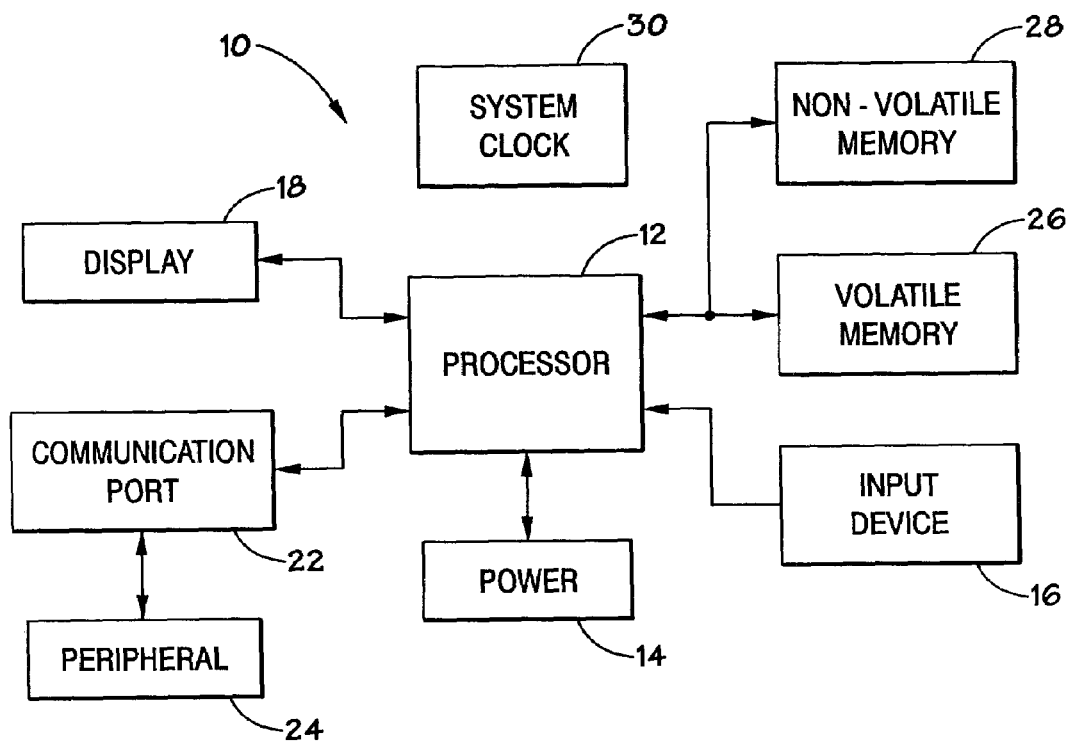
FIG. 1 is a block diagram of an electronic device containing integrated circuit devices that may employ embodiments of the present invention.

Turning now to the drawings, FIG. 1 is a block diagram depicting an exemplary processor-based electronic device, generally designated by the reference numeral 10. The device 10 may be any of a variety of different types, such as a computer, pager, cellular telephone, personal organizer, etc. In a typical processor-based device, a processor 12, such as a microprocessor, executes software to control the operation of the device 10.

The device 10 typically includes a power supply 14. For instance, if the device 10 is portable, the power supply 14 would advantageously include permanent batteries, replaceable batteries, and/or rechargeable batteries. The power supply 14 may also include an AC adapter, so that the device may be plugged into a wall outlet. In fact, the power supply 14 may also include a DC adapter, so that the device 10 may be plugged into a source of DC power such as the cigarette lighter receptacle in a vehicle.

Various other devices may be coupled to the processor 12, depending upon the functions that the device 10 performs. For instance, an input device 16 may be coupled to the processor 12. The input device 16 may include any type of device that allows a user to issue commands to the device 10. Examples of typical input devices include buttons, switches, a keyboard, a light pen, a mouse, and/or a voice recognition system. A display 18 may also be coupled to the processor 12. The display 18 may include an LCD display, a CRT, LEDs, and/or an audio display. A communication port 22 may also be coupled to the processor 12. The communication port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory is coupled to the processor 12 to store the programming and other data. For instance, the processor 12 may be coupled to volatile memory 26, which may include dynamic random access memory (DRAM), static random access memory (SRAM), Double Data Rate (DDR) memory, etc. The processor 12 may also be coupled to non-volatile memory 28. The non-volatile memory 28 may include a read-only memory (ROM), such as an EPROM or flash Memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk drive, tape drive memory, CD ROM drive, DVD, read/write CD ROM drive, and/or a floppy disk drive.

A system clock 30 may be connected to one or more of the components of the device 10. The connections between the system clock and other devices are not shown in FIG. 1 for purposes of clarity. The details of the connections between the system clock 30 and other components of the device 10 are not crucial aspects of the present invention. Examples of components within the device 10 that may be connected to the system clock 30 include the processor 12, the non-volatile memory 28 and the volatile memory 26.

The processor 12, the non-volatile memory 28 and the volatile memory 26 may be implemented as one or more integrated circuit components. Also, the processor 12, the non-volatile memory 28 and the volatile memory 26 are examples of integrated circuit components that may include input buffers.

Figure 2:
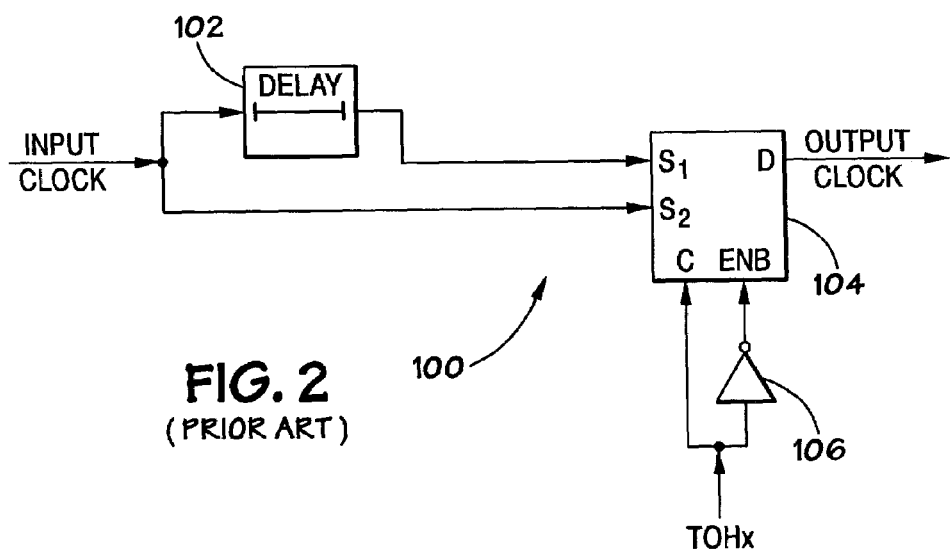
FIG. 2 is a block diagram of a known duty cycle correction circuit.

FIG. 2 is a block diagram of a known duty cycle correction circuit, which is generally referred to by the reference numeral 100. An INPUT CLOCK signal is provided to a delay line 102 and to the S2 input of a multiplexer 104. The output of the delay line 102 is provided to the S1 input of the multiplexer 104. A TOHx signal controls the operation of the multiplexer 104. The TOHx signal is a duty cycle correction signal that is generated inside the integrated circuit device and is used for duty cycle correction.

The TOHx signal may be connected to the control (C) input of the multiplexer, which selects one of the S inputs (either S1 or S2) to pass through the multiplexer 104 and deliver as an OUTPUT CLOCK signal. When the C input to the multiplexer 104 is at a predetermined logic level (for example, a low ("0") level), the S1 input will be delivered as the OUTPUT CLOCK signal from the multiplexer 104. When the C input to the multiplexer 104 is in the opposite logic state (for example, a high ("1") level), the S2 input will be delivered as the OUTPUT CLOCK signal from the multiplexer 104.

The TOHx signal is also delivered to the input of an inverter 106. The output of the inverter 106 is delivered as an ENABLE signal to the multiplexer 104. In this manner, the TOHx signal controls the source of the OUTPUT CLOCK signal. When the S2 input is selected by the TOHx signal, the INPUT CLOCK signal is passed directly through the multiplexer 104 to become the OUTPUT CLOCK signal. When the S1 input is selected, the delayed version of the INPUT CLOCK is passed through the multiplexer 104 to become the OUTPUT CLOCK signal. Thus, the TOHx signal may be used to control the duty cycle of the OUTPUT CLOCK signal. When the TOHx signal switches and changes the OUTPUT CLOCK from the S2 input to the S1 input, the effect is that the next logic state is slightly delayed with respect to the INPUT CLOCK signal. This delay adds a small amount of time to the next logic state of the clock. The addition of the slight delay to the next logic state of the OUTPUT CLOCK signal may be used to adjust the duty cycle of the OUTPUT CLOCK signal.

Figure 3:
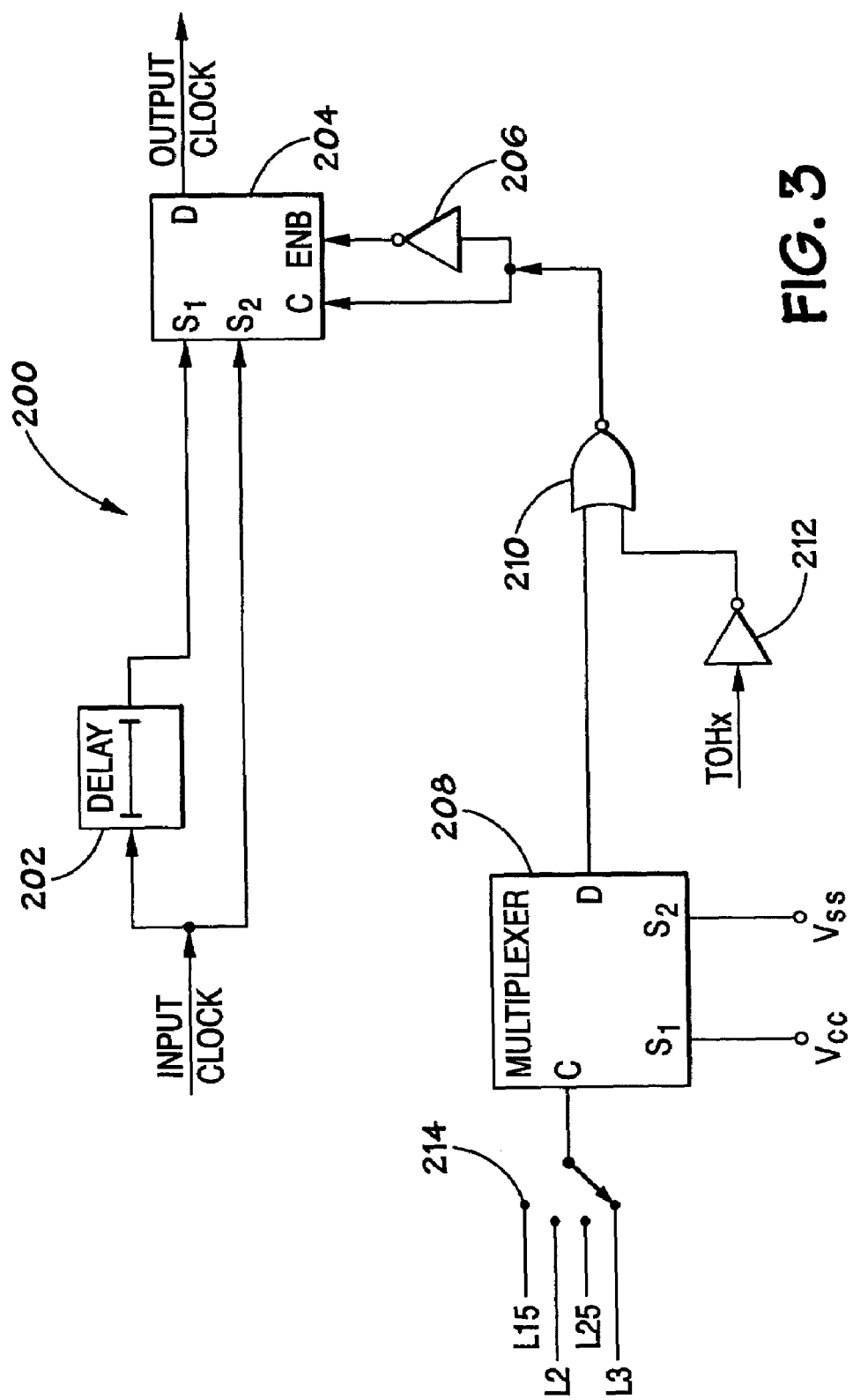
FIG. 3 is a block diagram of an embodiment of a duty cycle correction circuit of the present invention.

FIG. 3 is a block diagram of an embodiment of a duty cycle correction circuit of the present invention. The duty cycle correction circuit illustrated in FIG. 3, which is generally referred to by the reference numeral 200, adjusts the duty cycle of the OUTPUT CLOCK, but it takes into account a device latency signal.

An INPUT CLOCK signal is provided to a delay line 202 and to the S2 input of a multiplexer 204. The output of the delay line 202 is provided to the S1 input of the multiplexer 204.

In the embodiment illustrated in FIG. 3, one of a plurality of latency signals L15, L2, L25 and L3 are provided as inputs to a multiplexer 208. The latency signal L15 may correspond to a user-defined latency period of one and one-half (1½) clock cycles. The latency signal L2 may correspond to a user-defined latency period of two (2) clock cycles and so on. The latency signal that is selected may be programmed by a user of the device. For example, the user may be able to select the desired latency period using a load mode cycle.

The latency signals are illustrated in the exemplary embodiment shown in FIG. 3 as being delivered to a switch 214, which provides one of the latency signals to the control input of the multiplexer 208. The control input selects either the S1 input or the S2 input to provide as the output (D) of the multiplexer 208. The S1 input of the multiplexer 208 may be connected to a first supply voltage, which may be Vcc or some other level corresponding to a logic high ("1"). The S2 input of the multiplexer 208 may be connected to a second supply voltage, which may be Vss or some other level corresponding to a logic low ("0"). In this manner, the latency signal that is programmed by the user controls the output D of the multiplexer 208 by selecting the S1 input (a logical high) when in a first logical state and selecting the S2 input (a logical low) when in the opposite logical state.

The output of the multiplexer 208 is delivered as one input to a NOR gate 210. The latency signals L15, L2, L25 and L3 may be used to create an input to the NOR gate 210 in a wide range of configurations that will be determinable by those of ordinary skill in the art. These configurations may include direct input of the selected latency signal L15, L2, L25 or L3 to the NOR gate 210 or the use of a separate multiplexer similar to the multiplexer 208 for each latency signal. The specific implementation of the circuitry that provides a latency signal is not a crucial aspect of the invention.

In the exemplary embodiment shown in FIG. 3, the TOHx signal is delivered as an input to an inverter 212. The output of the inverter 212 is provided as a second input to the NOR gate 210. The output of the NOR gate 210 is connected to the control (C) input of a multiplexer 204 and to the input of an inverter 206. The output of the inverter 206 is provided as an ENABLE signal to the multiplexer 204.

As will be appreciated by those of ordinary skill in the art, the output of the NOR gate 210 will only be a logical high when both inputs to the NOR gate 210 are logical lows. Accordingly, the output of the NOR gate 210 will be a logical low any time the TOHx signal is low. This is true because the output of the inverter 212 (one of the inputs to the NOR gate 210) will always be high when the TOHx signal is low.

When TOHx is high, the output of the NOR gate 210 will follow the inversion of the input that the NOR gate 210 receives from the multiplexer 208. This means that, so long as the TOHx signal is high, the output of the NOR gate 210 will be high if the selected latency signal (L15, L2, L25 or L3) is low.

As set forth above, the output of the NOR gate 210 is provided as a control C input to the multiplexer 204. Thus, the output of the NOR gate 210 selects one of the S inputs (either S1 or S2) to pass through the multiplexer 204 and deliver as an OUTPUT CLOCK signal. When the C input to the multiplexer 204 is at a predetermined logic level (for example, a low ("0") level), the S1 input will be delivered as the OUTPUT CLOCK signal from the multiplexer 204. When the C input to the multiplexer 204 is in the opposite logic state (for example, a high ("1") level), the S2 input will be delivered as the OUTPUT CLOCK signal from the multiplexer 204.

Accordingly, when the TOHx signal is high, the selected latency signal (L15, L2, L25 or L3) are used to select whether the INPUT CLOCK signal or the delayed version of the INPUT CLOCK signal is passed through the multiplexer and employed as the OUTPUT CLOCK signal. This is true because the output of the NOR gate 210, which controls whether the INPUT CLOCK signal or the delayed INPUT CLOCK signal is chosen as the OUTPUT CLOCK signal, will be in one logical state so long as the selected latency signal (L15, L2, L25 or L3) is in a high logic state. The output of the NOR gate 210 will be in the opposite logic state when the selected latency signal is low. In this manner, the embodiment illustrated in FIG. 3 allows duty cycle correction based on a latency signal.

Figure 4:
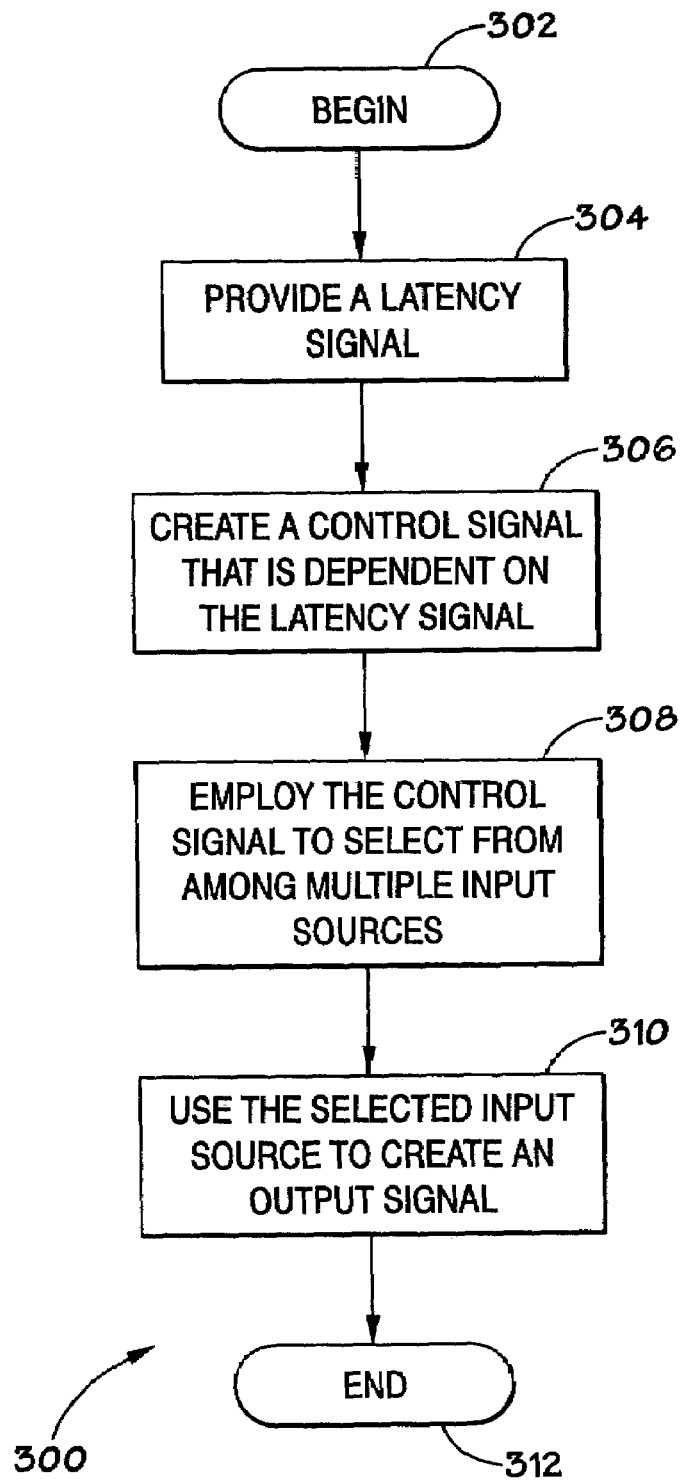
FIG. 4 is a process flow diagram showing the operation of an embodiment of the differential input buffer of the present invention.

FIG. 4 is a process flow diagram showing the operation of an embodiment of the differential input buffer of the present invention. The process is generally referred to by the reference numeral 300. At block 302, the process begins.

At block 304, a latency signal is provided. The latency signal may be generated as the result of a user selection. For example, the latency signal may correspond to data that is entered by the user during a load mode cycle of an integrated circuit device such as a DRAM. At block 306, the latency signal is used to create a control signal that is dependent on the latency signal. The output of the multiplexer 208 (FIG. 3) or the NOR gate 210 (FIG. 3) are examples of control signals that are dependent on the selected latency signal.

The control signal that is dependent on the latency signal is used to select from among multiple input sources, as shown at block 308. Examples of multiple input sources include the INPUT CLOCK signal and the delayed version of the input clock signal produced by the delay line 202 (FIG. 3). The selected input source is used to create an output signal, as shown at block 310. In this manner, the control signal that depends on the latency signal may be used to adjust the duty cycle of an output signal such as the OUTPUT CLOCK signal illustrated in FIG. 3. The process ends at block 312.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A duty cycle correction circuit, comprising:
    circuitry adapted to use a latency signal and a duty cycle correction signal to produce a duty cycle control signal; and
    circuitry adapted to deliver an output signal responsive to the duty cycle control signal, the output signal comprising at least one of a plurality of input sources, the at least one of the plurality of input sources being selected so that the output signal maintains a specific duty cycle.

2. The duty cycle correction circuit of claim 1 wherein at least one attribute of the latency signal is selectable by a user.

3. The duty cycle correction circuit of claim 1 wherein at least one attribute of the latency signal is selectable during a load mode cycle of an integrated circuit device.

4. The duty cycle correction circuit of claim 3 wherein the integrated circuit device is a dynamic random access memory (DRAM).

5. The duty cycle correction circuit of claim 1 wherein the plurality of input sources comprises an INPUT CLOCK signal and a delayed version of the INPUT CLOCK signal.

6. The duty cycle correction circuit of claim 5 wherein the circuitry that delivers the output signal comprises a multiplexer that is adapted to receive the INPUT CLOCK signal and the delayed version of the INPUT CLOCK signal.

7. The duty cycle correction circuit of claim 6 wherein the control signal is delivered to the multiplexer and is used to select either the INPUT CLOCK signal or the delayed version of the INPUT CLOCK signal to comprise the output signal.

8. An integrated circuit device that comprises a control circuit, the control circuit comprising:
   circuitry adapted to use a latency signal and a duty cycle correction signal to produce a duty cycle control signal; and
   circuitry adapted to deliver an output signal responsive to the duty cycle control signal, the output signal comprising at least one of a plurality of input sources, the at least one of the plurality of input sources being selected so that the output signal maintains a specific duty cycle.

9. The integrated circuit device of claim 8 wherein at least one attribute of the latency signal is selectable by a user.

10. The integrated circuit device of claim 8 wherein at least one attribute of the latency signal is selectable during a load mode cycle of an integrated circuit device.

11. The integrated circuit device of claim 10 wherein the integrated circuit device is a dynamic random access memory (DRAM).

12. The integrated circuit device of claim 8 wherein the plurality of input sources comprises an INPUT CLOCK signal and a delayed version of the INPUT CLOCK signal.

13. The integrated circuit device of claim 12 wherein the circuitry that delivers the output signal comprises a multiplexer that is adapted to receive the INPUT CLOCK signal and the delayed version of the INPUT CLOCK signal.

14. The integrated circuit device of claim 13 wherein the duty cycle control signal is delivered to the multiplexer and is used to select either the INPUT CLOCK signal or the delayed version of the INPUT CLOCK signal to comprise the output signal.

15. The integrated circuit device of claim 8 wherein the integrated circuit device comprises a dynamic random access memory (DRAM).

16. An electronic device, comprising:
   a processor;
   a power supply adapted to provide power to the processor;
   a user input device adapted to receive input from a user and to provide the input to the processor;
   a display device adapted to display information; and
   a volatile memory device that comprises a duty cycle correction circuit, the duty cycle correction circuit comprising:
   circuitry adapted to use a latency signal and a duty cycle correction signal to produce a duty cycle control signal; and
   circuitry adapted to deliver an output signal responsive to the control signal, the output signal comprising at least one of a plurality of input sources, the at least one of the plurality of input sources being selected so that the output signal maintains a specific duty cycle.

17. The electronic device of claim 16 wherein at least one attribute of the latency signal is selectable by a user.

18. The electronic device of claim 16 wherein at least one attribute of the latency signal is selectable during a load mode cycle of an integrated circuit device.

19. The electronic device of claim 18 wherein the integrated circuit device is a dynamic random access memory (DRAM).

20. The electronic device of claim 16 wherein the plurality of input sources comprises an INPUT CLOCK signal and a delayed version of the INPUT CLOCK signal.

21. The electronic device of claim 20 wherein the circuitry that delivers the output signal comprises a multiplexer that is adapted to receive the INPUT CLOCK signal and the delayed version of the INPUT CLOCK signal.

22. The electronic device of claim 21 wherein the duty cycle control signal is delivered to the multiplexer and is used to select either the INPUT CLOCK signal or the delayed version of the INPUT CLOCK signal to comprise the output signal.

23. The electronic device of claim 16 wherein the volatile memory device comprises a dynamic random access memory (DRAM).

24. A method of correcting the duty cycle of an output signal, comprising the acts of:
   providing a latency signal;
   creating a duty cycle control signal that is dependent on the latency signal;
   employing the duty cycle control signal to chose a selected input source from among multiple input sources; and
   using the selected input source to create an output signal; and
   wherein the selected input source is chosen so that the output signal maintains a specific duty cycle.

25. The method of claim 24 comprising selecting at least one attribute of the latency signal.

26. The method of claim 24 comprising selecting at least one attribute of the latency signal during a load mode cycle of an integrated circuit device.

27. The method of claim 26 wherein the integrated circuit device is a dynamic random access memory (DRAM).

28. The method of claim 24 wherein the multiple input sources comprise an INPUT CLOCK signal and a delayed version of the INPUT CLOCK signal.

29. The method of claim 28 comprising delivering the INPUT CLOCK signal and the delayed version of the INPUT CLOCK signal to a multiplexer.

30. The method of claim 29 comprising:
   delivering the duty cycle control signal to the multiplexer; and
   using the duty cycle control signal to select either the INPUT CLOCK signal or the delayed version of the INPUT CLOCK signal to comprise the output signal.

* * * * *